(12) United States Patent
Akaogi

(10) Patent No.: US 6,542,415 B2
(45) Date of Patent: Apr. 1, 2003

(54) KICKB SIGNAL GENERATOR

(75) Inventor: Takao Akaogi, Cupertino, CA (US)

(73) Assignee: Fujitsu Limited (JP)

(*) Notice: Subject to any disclaimer, the term of this patent is extended or adjusted under 35 U.S.C. 154(b) by 0 days.

(21) Appl. No.: 09/932,077

(22) Filed: Aug. 17, 2001

(65) Prior Publication Data

US 2003/0035326 A1 Feb. 20, 2003

(51) Int. Cl.$^7$ ................................................ G11C 7/00
(52) U.S. Cl. .......................... 365/189.11; 365/230.06; 365/233.5
(58) Field of Search .................. 365/230.06, 230.08, 365/23.5, 241, 189.11, 189.07

(56) References Cited

U.S. PATENT DOCUMENTS

| | | | | |
|---|---|---|---|---|
| 4,984,204 A | * | 1/1991 | Sato et al. | ............. 365/189.11 |
| 5,459,693 A | * | 10/1995 | Komarek et al. | ........... 365/207 |
| 5,596,544 A | * | 1/1997 | Komarek et al. | ........ 365/233.5 |
| 5,907,517 A | * | 5/1999 | Komarek et al. | ........... 365/210 |

* cited by examiner

Primary Examiner—David Nelms
Assistant Examiner—Gene N. Auduong
(74) Attorney, Agent, or Firm—Coudert Brothers LLP

(57) ABSTRACT

A signal generator for generating a kickb signal used to reset a boost signal used to operate a memory device. The signal generator includes an address detector that receives one or more address lines and a clock signal to produce a detector output. A switch circuit is also included that receives the detector output, the clock signal and a feedback signal to produce a switch output. A delay circuit is coupled to receive the switch output to produce a delayed switch output, and an output circuit is coupled to receive the switch output and the delayed switch output to produce the kickb signal, where the kickb signal forms the feedback signal.

6 Claims, 3 Drawing Sheets

KICKB SIGNAL GENERATOR

FIELD OF THE INVENTION

The present invention relates generally to accessing a memory device, and more particularly, to a signal generator for generating memory access signals used to access a memory device for improves performance.

BACKGROUND OF THE INVENTION

As processing system performance increases, a corresponding increase in memory performance is required. In order to meet past performance demands, burst mode memory operation was introduced. During burst mode operation, the memory operates with a synchronizing clock to access multiple sequential memory locations. For example, during a burst mode read operation, the synchronizing clock is used to read sequential memory locations while clocking out previously read data every clock cycle. Using this technique, high data transfer rates can be realized. Recently, however, even higher memory performance has become a requirement.

Since burst mode operation is a sequential operation, during memory accesses cell row addresses do not change until the end of an internal column address is reached. Usually the memory power source voltage (Vcc) is not high enough to turn on a core cell that may have a threshold voltage (Vt) of approximately 2.5 volts. To create a sufficient word line voltage to access the core cell, the Vcc voltage is boosted. Since a word line does not switch until the internal address hits the end of the column address, the word line voltage boosting circuit does not have to switch until the end of the internal column address is reached.

As for core data access operations, assuming that there are a set of two sense amplifiers (SYA) devices that use two clock cycles to output data from the core, an address detection signal (ATD) used to detect address changes, is generated every two clocks. Usually the boost operation is triggered by the ATD signal, so typical boost circuits are designed to detect and use the ATD signal to trigger the boost.

FIG. 1 shows a typical boost circuit 102 used to boost the voltage of a memory word line signal. The boost circuit 102 is shown coupled to a decoder 104 that produces a word line output signal 106 by decoding address input 107. When the kickb signal is at a high level, the booster output voltage (Vb) at output node Nb is set to the level of Vcc by n-channel depletion transistor 108. When the kickb signal goes low, then a boosting of the signal Vb occurs and is expressed as:

$$Vb=((Cb/(Cb+Cd))+1)*Vcc$$

where Cd is the capacitive effect of the decoder as shown at 110.

FIG. 2 shows signal timing of signals associated with the boost circuit of FIG. 1. Address signals are shown to describe the generation of the kickb signal. Every time address signal A0 is at a high level and the rising edge of clock (CLK) occurs, an ATD signal is generated. The ATD signal is also generated when all of the addresses are high, as indicated by the "last column Ad" signal, and a rising edge of the CLK occurs. This ATD signal generates the kickb signal that is used to reset and activate the boosting signal, as shown by the waveform associated with Vb. In order to realize this signal timing, it is necessary to have an ATD generator to generate the ATD signal that is used to generate the kickb signal that is used to execute the subsequent reset and boosting operation.

FIG. 3 shows a typical ATD generator circuit 300. When the clock (CLK) signal goes to a high level (rising edge) while address bit A0 is at a high level, the signal level at node "a" goes to a low level, and as a result, the ATD signal will be triggered so that a high level will appear at output 302. After the signal at the node "a" propagates through a delay element, a signal at node "b" goes to a low level to terminate the ATD signal so that a low level then appears at the output 302. Thus, the address bit A0 and the clock signal (CLK) are used to generate the ATD signal.

FIG. 4 shows a typical boost trigger circuit 400. The boost trigger circuit 400 receives the ATD signal from the ATD generator circuit 300 and generates a kickb signal that triggers the reset and boost operation. When CLK signal goes to a high level while all of column addresses are high, then the signal at node Bt goes to a high level. In this state, if the ATD signal goes to a high level, the kickb signal goes high to reset the boost circuit (see FIG. 1). When the ATD signal goes to a low level, the kickb signal goes to a low level and triggers the boost function.

In the circuit of FIG. 4, the kickb signal is generated with AND logic that combines the Bt and ATD signals. However, since the main goal of the burst mode architecture is to improve memory performance, as memories become faster and faster the kickb signal needs to have a correspondingly fast activation time. One problem with the above described kickb generation circuits is that they have speed limitations in that there are delays associated with the generation and combination of the Bt and ATD signals. These delays may slow the generation of the kickb signal. For example, capacitive loading on the ATD line may slow the ATD signal and ultimately delay the generation of the kickb signal, and thus limit the operational speed of the memory.

Therefore, it is desirable to have a way to generate a kickb signal to reset and trigger the boost operation of a memory device, where the generation of the kickb signal does not suffer from delays associated with detecting and combining the Bt and ATD signals.

SUMMARY OF THE INVENTION

The present invention includes a system for generating a kickb signal for use with a memory device. The kickb signal is a boost activation signal that is used to reset and activate a boost circuit to boost a memory access signal. For example, the boost circuit boosts a word line signal used during a burst mode memory access. The system generates the kickb signal without introducing time delays associated with conventional circuits, so that increased memory performance is possible. For example, during burst mode operation of a high performance memory device, the system provides fast activation of the kickb signal to allow fast reset of a voltage boosting circuit that boosts the voltage of memory signals used to access core cells of the high performance memory device.

In one embodiment of the invention, a signal generator for generating a kickb signal used to reset a boost signal used to operate a memory device is provided. The signal generator includes an address detector that receives one or more address lines and a clock signal to produce a detector output. A switch circuit is also included that receives the detector output, the clock signal and a feedback signal to produce a switch output. A delay circuit is coupled to receive the switch output to produce a delayed switch output, and an output circuit is provided that is coupled to receive the switch output and the delayed switch output to produce the kickb signal, where the kickb signal forms the feedback signal.

BRIEF DESCRIPTION OF THE DRAWINGS

The forgoing aspects and the attendant advantages of this invention will become more readily apparent by reference to the following detailed description when taken in conjunction with the accompanying drawings wherein.

DETAILED DESCRIPTION OF THE INVENTION

The present invention includes a system for generating a kickb signal use to access a memory device. One or more embodiments included in the present invention will now be described, however, it is possible to make changes and variations to the described embodiments without deviating from the scope of the present invention.

Exemplary Kickb Signal Generator

Figure 1:
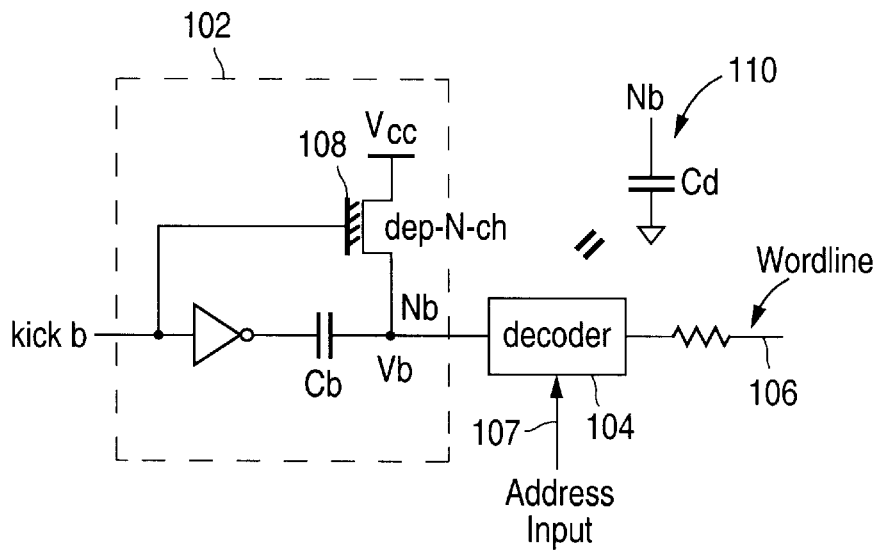
FIG. 1 shows a typical boost circuit that has been simplified for clarity.
Figure 2:
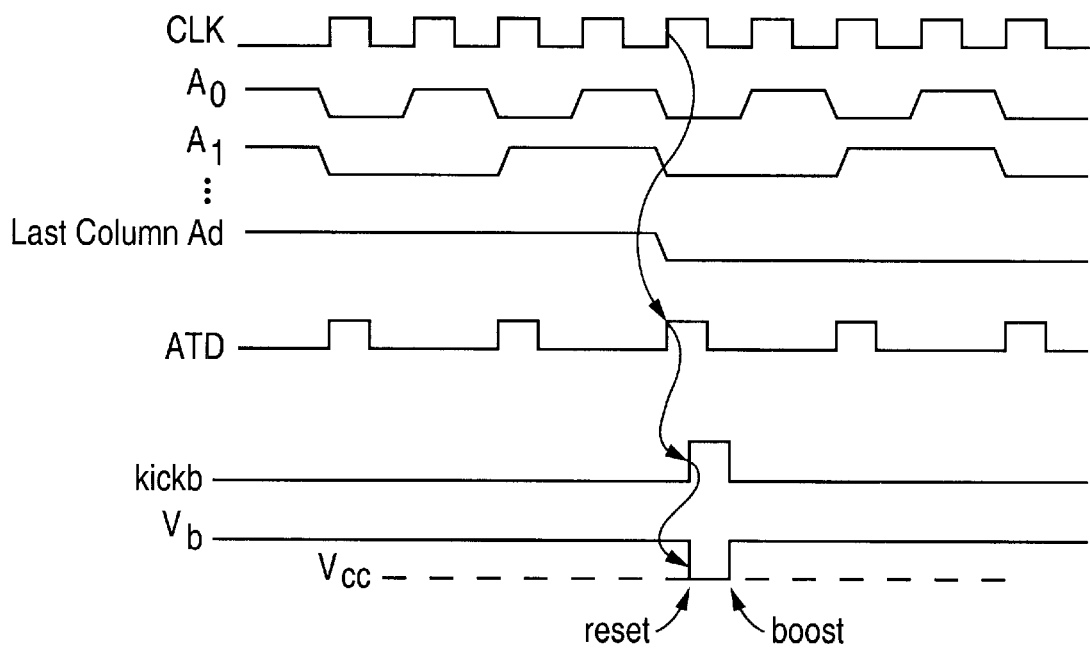
FIG. 2 shows signal timing of signals associated with the boost circuit of FIG. 1.
Figure 3:
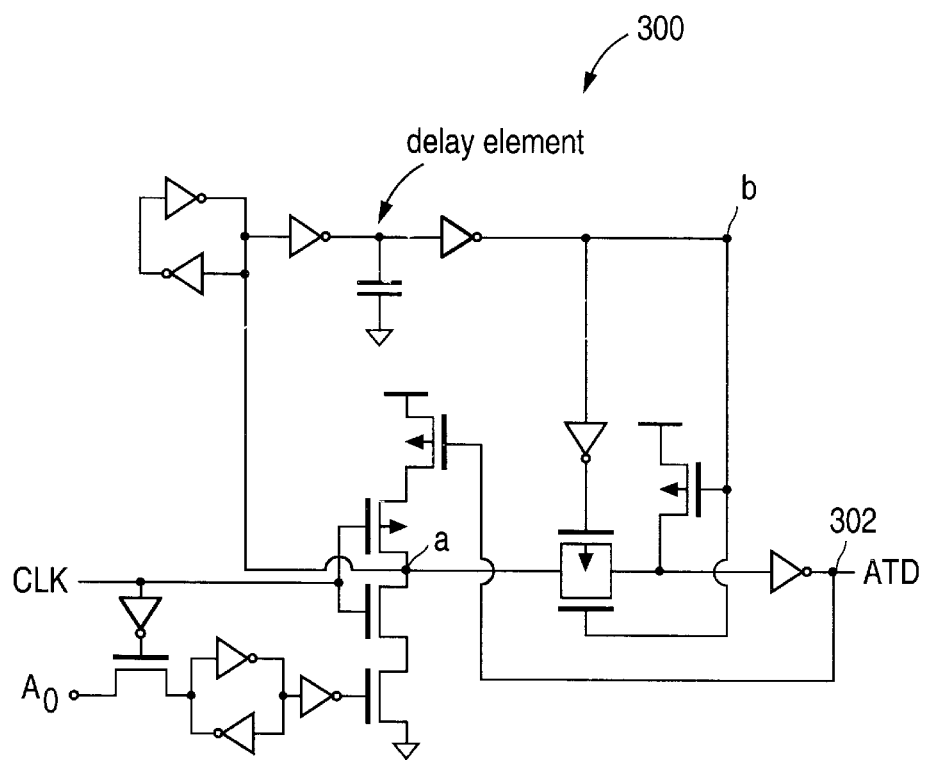
FIG. 3 shows a typical ATD generator circuit.
Figure 4:
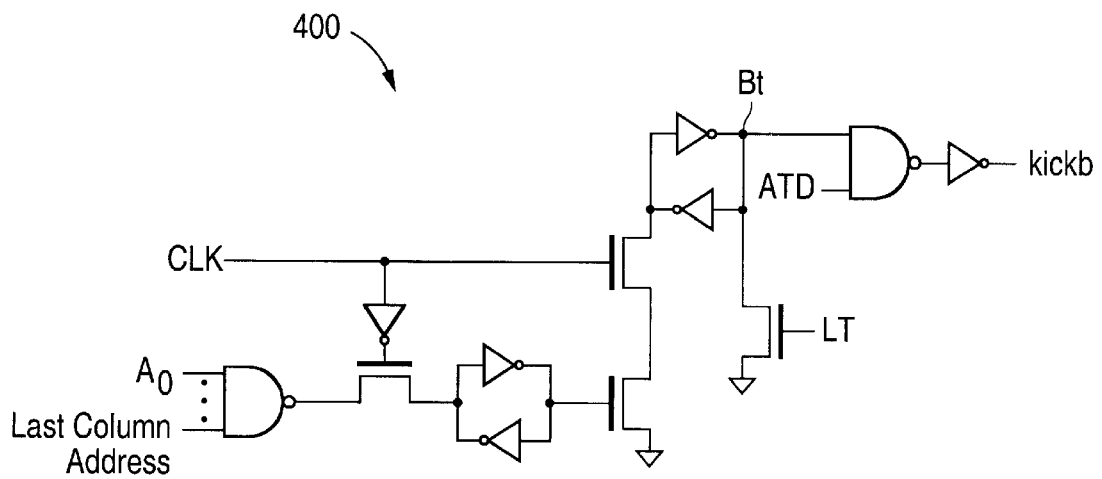
FIG. 4 shows a typical boost trigger circuit.
Figure 5:
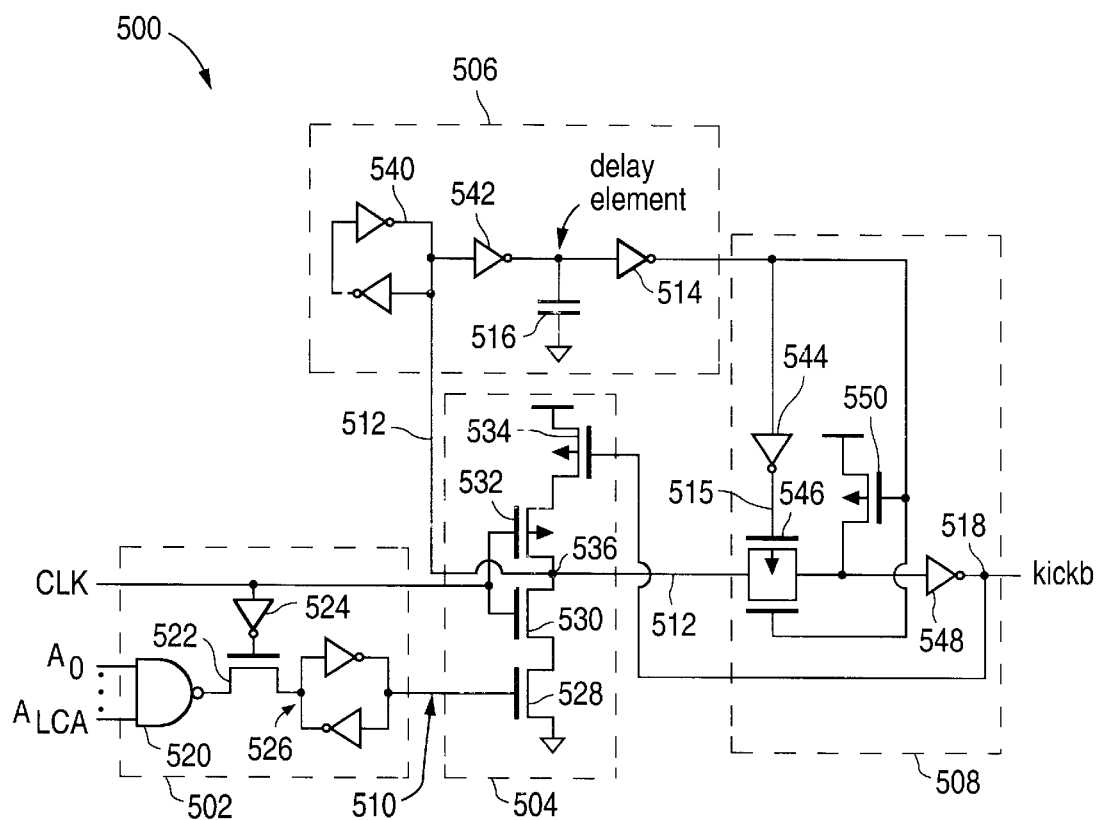
FIG. 5 shows one embodiment of a kickb signal generator constructed in accordance with the present invention.

FIG. 5 shows one embodiment of a kickb signal generator 500 constructed in accordance with the present invention. The signal generator 500 receives address and clock signals to produce a kickb output signal 518. The signal generator 500 includes an address detection circuit 502, a switch circuit 504, a delay circuit 506 and an output circuit 508.

The address detection circuit 502 receives a clock signal (CLK) and a set of column address lines ($A_0$–$A_{1ca}$), where $A_{1ca}$ is the last column address line. The detection circuit 502 outputs a detection output 510 to the switch circuit 504. The set of address lines is received by NAND gate 520, which has an output coupled to an N channel transistor 522. The CLK signal is coupled to a gate of the transistor 522 via inverter 524. The transistor 522 is also coupled to a latch circuit 526 that produces the detection output 510.

The switch circuit 504 receives the detection output and the CLK signal and produces a switch output 512 that is coupled to the delay circuit 506 and the output circuit 508. The switch circuit also receives the kickb output signal 518 as a feedback input. The switch 504 includes N channel transistor 528, N channel transistor 530, P channel transistor 532, and P channel transistor 534. Transistor 530 is coupled to transistors 532 and 528, and receives the CLK signal at its gate terminal. Transistor 528 is coupled to receive the detection output 510 at its gate terminal. Transistor 532 is coupled to transistor 530 at node 536, which forms the switch output 512. Transistor 534 receives the kickb output signal at its gate terminal.

The delay circuit 506 receives the switch output 512 and produces a delay output 514. The amount of delay introduced by the delay circuit is controlled, at least in part, by capacitor 516. The delay circuit 506 includes a delay latch circuit 540 coupled to an inverter 542 that receives as input, the switch output 512. The inverter 542 is coupled to the capacitor 516 and inverter 544. The inverter 544 outputs the delay output signal as shown at 514.

The output circuit 508 receives the switch output 512 and the delay output 514 to produce the kickb output signal 518. The output circuit 508 includes inverter 544 that received the delay output 514 and produces an inverter output 515 that is coupled to transfer gate 546. The transfer gate 546 includes N channel and P channel transistors coupled together at common drain and source terminals. The transfer gate 546 also receives the delay output 514 and the switch output 512 and is further coupled to inverter 548, which produces the kickb output signal 518. A P channel transistor 550 is also coupled to the transfer gate 546 and the delay output 514.

During operation of the generator 500, the CLK signal is used to generate the kickb signal directly. As a result, the kickb signal will be generated more quickly than is possible using conventional circuits, and thereby provides for improved booster performance enabling the use of higher performance memory devices. In effect, the generator 500 enables a memory boost signal to be reset very quickly, as demonstrated in the following timing diagram.

Figure 6:
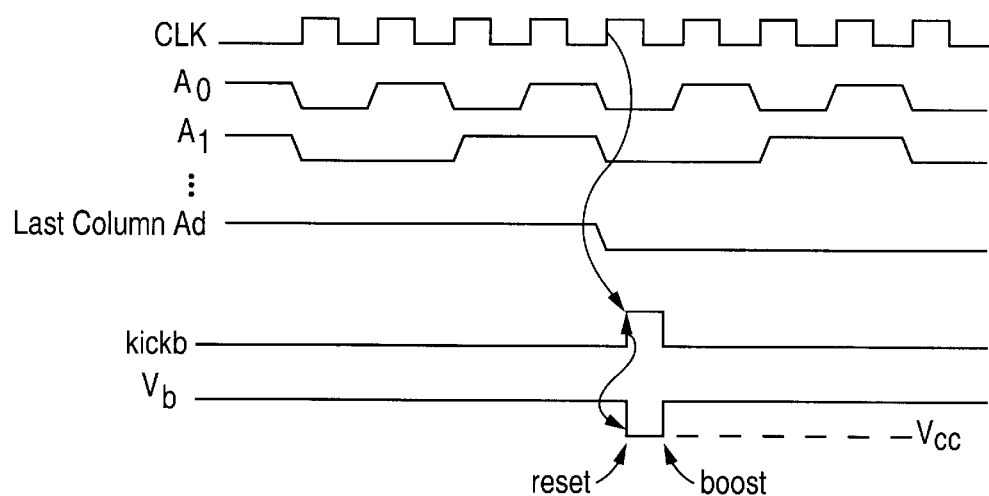
FIG. 6 shows a timing diagram illustrating signal timing of signals associated with the kickb signal generator of FIG. 5.

FIG. 6 shows timing diagram 600 illustrating signal timing of signals associated with the kickb signal generator of FIG. 5. The timing diagram 600 demonstrates that the circuit 500 uses clock (CLK) and address bit ($A_n$) signals to directly generate the kickb signal. The circuit 500 operates to generate the kickb signal as soon as the last address is reached, so that the kickb signal can reset a boost signal (Vb) much faster than conventional circuits. As a result, the generation of the kickb signal does not limit memory operating speeds. Also shown is a delay period for the kickb signal that is determined by the delay circuit 506.

The present invention includes a system for generating a kickb signal for fast reset of a boost signal use with a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention which is set forth in the following claims.

What is claimed is:

1. A signal generator for generating a kickb signal that resets a boost signal used to operate a memory device, the signal generator comprising:

an address detector that receives a plurality of address lines and a clock signal to produce a detector output;

a switch circuit that receives the detector output, the clock signal and a feedback signal to produce a switch output;

a delay circuit coupled to receive the switch output to produce a delayed switch output; and an output circuit coupled to receive the switch output and the delayed switch output to produce the kickb signal, and wherein the kickb signal forms the feedback signal.

2. The signal generator of claim 1, wherein the address detector includes a detector latch that outputs the detector output.

3. The signal generator of claim 2, wherein the switch circuit comprises:

a first transistor coupled to receive the detector output; and a second transistor coupled to receive the feedback signal.

5. The signal generator of claim 3, wherein the delay circuit includes a delay latch coupled to receive the switch output signal.

5. The signal generator of claim 4, wherein the output circuit includes a transfer gate coupled to receive the switch output the delayed switch output.

6. A method for generating a kickb signal that resets a boost signal used to operate a memory device, the method comprising steps of:

receiving a plurality of address lines and a clock signal to produce a detector output;

receiving the detector output, the clock signal and a feedback signal to produce a switch output;

receiving the switch output to produce a delayed output; and receiving the switch output and the delayed output to produce the kickb signal, and wherein the kickb signal forms the feedback signal.

* * * * *